(12) United States Patent
Hong et al.

(10) Patent No.: US 10,756,075 B2
(45) Date of Patent: Aug. 25, 2020

(54) PACKAGE-ON-PACKAGE TYPE SEMICONDUCTOR PACKAGE AND METHOD FOR MANUFACTURING THE SAME

(71) Applicant: SAMSUNG ELECTRONICS CO., LTD., Suwon-si, Gyeonggi-do (KR)

(72) Inventors: Min Gi Hong, Hwaseong-si (KR); Yong Kwan Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 33 days.

(21) Appl. No.: 16/167,173

(22) Filed: Oct. 22, 2018

(65) Prior Publication Data

US 2019/0363073 A1 Nov. 28, 2019

(30) Foreign Application Priority Data

May 24, 2018 (KR) ........................ 10-2018-0058877

(51) Int. Cl.
*H01L 25/18* (2006.01)
*H01L 23/00* (2006.01)
*H01L 25/00* (2006.01)
*H01L 23/538* (2006.01)
*H01L 23/18* (2006.01)
*H01L 23/31* (2006.01)

(52) U.S. Cl.
CPC ............. *H01L 25/18* (2013.01); *H01L 23/18* (2013.01); *H01L 23/3135* (2013.01); *H01L 23/5385* (2013.01); *H01L 24/09* (2013.01); *H01L 24/17* (2013.01); *H01L 24/49* (2013.01); *H01L 24/73* (2013.01); *H01L 25/50* (2013.01); *H01L 2224/73257* (2013.01); *H01L 2225/107* (2013.01)

(58) Field of Classification Search
CPC .................................................. H01L 23/3135
USPC .......................... 257/790, E23.126, E23.134
See application file for complete search history.

(56) References Cited

U.S. PATENT DOCUMENTS 6,271,059 B1 * 8/2001 Bertin .................... H01L 23/13
257/E21.511
8,089,143 B2 * 1/2012 Lee ........................ H01L 23/13
257/678

(Continued)

FOREIGN PATENT DOCUMENTS

| JP | 2004281920 A | 10/2004 |
| JP | 2012114173 A | 6/2012 |
| KR | 1624850 A | 8/2015 |

*Primary Examiner* — Victoria K. Hall
(74) *Attorney, Agent, or Firm* — Volentine, Whitt & Francos, PLLC

(57) ABSTRACT

A semiconductor device package-on-package (PoP) includes a first package, a second package, an interposer, a first molding layer, and a second molding layer. The first package includes a first substrate and a first semiconductor chip on the first substrate. The second package is disposed on the first package and includes a second substrate and a second semiconductor chip on the second substrate. The interposer is disposed between the first package and the second package and connects the first package and the second package. A first molding layer fills a space between the first package and the interposer. A second molding layer covers an upper surface of the interposer.

18 Claims, 14 Drawing Sheets

(56) References Cited

U.S. PATENT DOCUMENTS

| | | | |
|---|---|---|---|
| 8,288,209 B1* | 10/2012 | Chi | H01L 21/4832 438/106 |
| 8,399,992 B2* | 3/2013 | Park | H01L 23/3128 257/678 |
| 8,530,277 B2 | 9/2013 | Ko et al. | |
| 8,531,043 B2 | 9/2013 | Ha et al. | |
| 8,546,929 B2* | 10/2013 | Ong | H01L 23/3128 257/685 |
| 8,633,598 B1* | 1/2014 | St. Amand | H01L 23/3135 257/778 |
| 8,779,562 B2 | 7/2014 | Lee et al. | |
| 8,779,606 B2* | 7/2014 | Yim | H01L 23/10 257/790 |
| 8,829,686 B2* | 9/2014 | Hong | H01L 23/498 257/777 |
| 8,928,132 B2* | 1/2015 | Choi | H01L 23/3128 257/686 |
| 8,941,225 B2* | 1/2015 | Choi | H01L 25/50 257/686 |
| 9,024,426 B2* | 5/2015 | Yeom | H01L 23/481 257/686 |
| 9,252,031 B2* | 2/2016 | Im | H01L 23/3677 |
| 9,305,855 B2* | 4/2016 | Kim | H01L 23/28 |
| 9,349,713 B2* | 5/2016 | Kim | H01L 24/97 |
| 9,502,360 B2 | 11/2016 | Lin et al. | |
| 9,583,430 B2* | 2/2017 | Park | H01L 23/3128 |
| 9,640,513 B2* | 5/2017 | Lee | H01L 25/0652 |
| 10,032,740 B2* | 7/2018 | Paek | H01L 24/17 |
| 10,325,891 B1* | 6/2019 | Lim | H01L 23/49838 |
| 10,354,974 B2* | 7/2019 | Hsu | H01L 23/3135 |
| 10,438,934 B1* | 10/2019 | Lin | H01L 25/0655 |
| 10,475,749 B2* | 11/2019 | Kim | H01L 23/49816 |
| 10,497,688 B2* | 12/2019 | Tsukiyama | H01L 24/20 |
| 10,622,340 B2* | 4/2020 | Jeong | H01L 23/3121 |
| 2004/0195667 A1* | 10/2004 | Karnezos | H01L 23/3135 257/686 |
| 2004/0227240 A1* | 11/2004 | Bolken | H01L 21/565 257/738 |
| 2005/0110166 A1 | 5/2005 | Aoyagi | |
| 2006/0284299 A1* | 12/2006 | Karnezos | H01L 23/3128 257/686 |
| 2007/0114648 A1* | 5/2007 | Karnezos | H01L 21/563 257/686 |
| 2009/0067143 A1* | 3/2009 | Lee | H01L 23/3128 361/764 |
| 2009/0286108 A1* | 11/2009 | Kim | H01L 23/58 429/431 |
| 2009/0309204 A1* | 12/2009 | Ha | H01L 23/16 257/686 |
| 2009/0309239 A1* | 12/2009 | Nishimura | H01L 21/568 257/778 |
| 2011/0215451 A1* | 9/2011 | Yim | H01L 24/73 257/666 |
| 2011/0298106 A1* | 12/2011 | Kim | H01L 23/3121 257/659 |
| 2011/0298119 A1* | 12/2011 | Cho | H01L 23/3128 257/686 |
| 2012/0032314 A1* | 2/2012 | Chen | H01L 23/3135 257/666 |
| 2012/0086003 A1* | 4/2012 | Park | H01L 21/56 257/48 |
| 2012/0126423 A1 | 5/2012 | Hatori et al. | |
| 2012/0306062 A1* | 12/2012 | Kim | H01L 24/97 257/659 |
| 2013/0001798 A1* | 1/2013 | Choi | H01L 23/49827 257/774 |
| 2013/0037950 A1* | 2/2013 | Yu | H01L 23/49816 257/738 |
| 2013/0075926 A1* | 3/2013 | Bae | H01L 25/03 257/774 |
| 2013/0161836 A1* | 6/2013 | Yeom | H01L 25/105 257/778 |
| 2013/0187288 A1* | 7/2013 | Hong | H01L 25/105 257/774 |
| 2014/0210109 A1* | 7/2014 | Tanaka | H01L 23/145 257/778 |
| 2014/0264914 A1* | 9/2014 | Meyer | H01L 23/31 257/774 |
| 2014/0361442 A1* | 12/2014 | Lee | H01L 23/564 257/777 |
| 2015/0102484 A1* | 4/2015 | Chen | H01L 23/3121 257/737 |
| 2015/0115443 A1* | 4/2015 | Oh | H01L 23/3135 257/738 |
| 2015/0115467 A1* | 4/2015 | Park | H01L 23/3128 257/774 |
| 2015/0162316 A1* | 6/2015 | Yu | H01L 23/04 257/704 |
| 2015/0221573 A1* | 8/2015 | Paek | H01L 21/56 257/738 |
| 2015/0262900 A1* | 9/2015 | Wang | H01L 23/04 257/704 |
| 2016/0027764 A1* | 1/2016 | Kim | H01L 24/97 257/686 |
| 2016/0061677 A1* | 3/2016 | Han | B81B 7/0048 257/415 |
| 2016/0071831 A1* | 3/2016 | Lee | H01L 23/49838 257/690 |
| 2016/0172334 A1* | 6/2016 | Hsu | H01L 23/3135 257/692 |
| 2016/0190107 A1* | 6/2016 | Meyer | H01L 23/31 257/686 |
| 2016/0260684 A1* | 9/2016 | Zhai | H01L 25/0652 |
| 2016/0307778 A1 | 10/2016 | Lin et al. | |
| 2016/0315071 A1* | 10/2016 | Zhai | H01L 24/19 |
| 2017/0068633 A1* | 3/2017 | Kwon | H01L 25/105 |
| 2018/0145061 A1* | 5/2018 | Jeong | H01L 23/3135 |
| 2018/0226356 A1* | 8/2018 | Ikeda | H01L 25/16 |
| 2019/0013299 A1* | 1/2019 | Lee | H01L 23/552 |
| 2019/0067247 A1* | 2/2019 | Yoo | H01L 21/561 |
| 2019/0074267 A1* | 3/2019 | Yang | H01L 23/5386 |
| 2019/0103364 A1* | 4/2019 | Kim | H01L 23/49816 |
| 2019/0115325 A1* | 4/2019 | Im | H01L 23/3675 |
| 2019/0148269 A1* | 5/2019 | Cheah | H01L 23/5387 257/723 |
| 2019/0355667 A1* | 11/2019 | Kwon | H01L 23/5386 |
| 2019/0363073 A1* | 11/2019 | Hong | H01L 23/5385 |
| 2019/0393200 A1* | 12/2019 | Chang Chien | H01L 23/3114 |
| 2020/0006292 A1* | 1/2020 | Choi | H01L 25/0657 |

\* cited by examiner

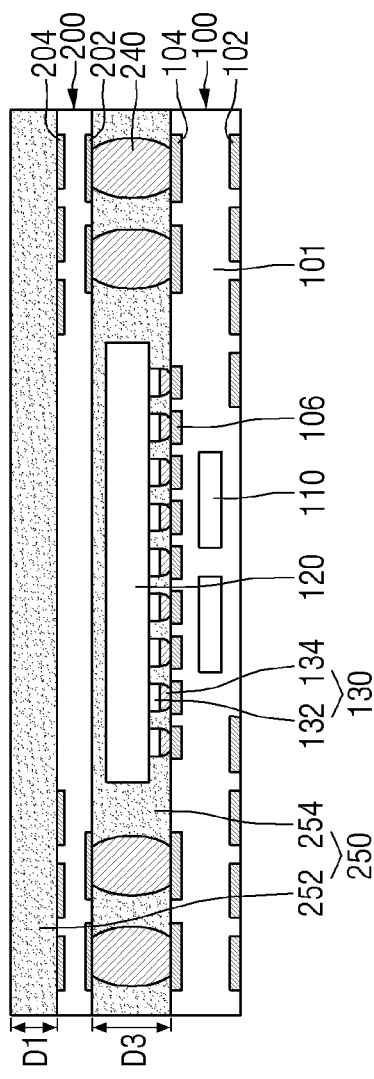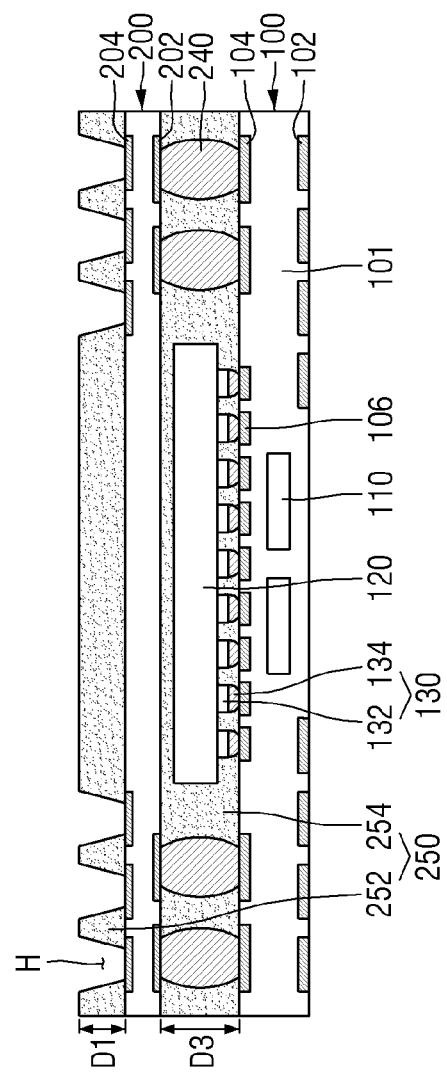

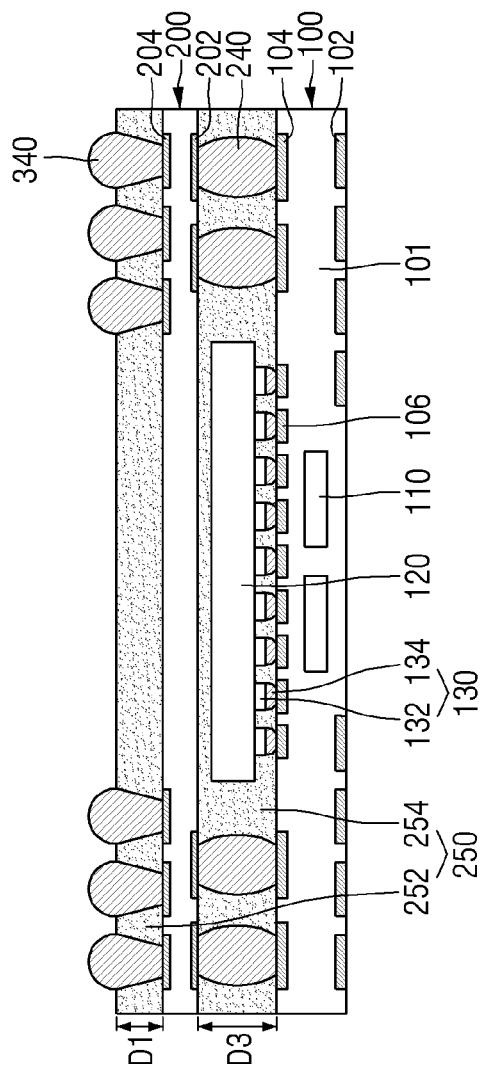
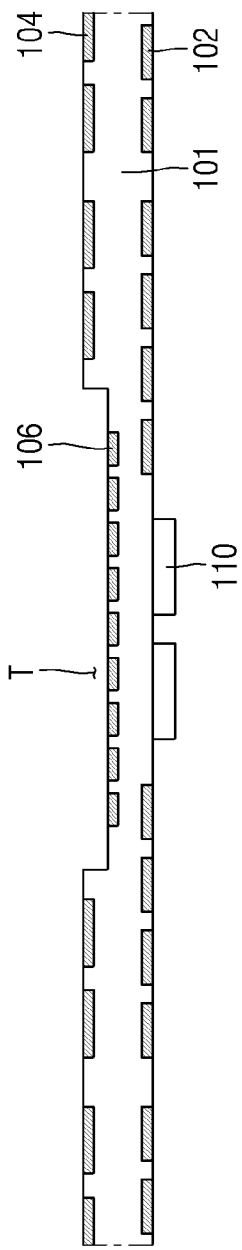

PACKAGE-ON-PACKAGE TYPE SEMICONDUCTOR PACKAGE AND METHOD FOR MANUFACTURING THE SAME

PRIORITY STATEMENT

This application claims priority under 35 U.S.C. § 119 to Korean Patent Application No. 10-2018-0058877 filed on May 24, 2018 in the Korean Intellectual Property Office, the disclosure of which is hereby incorporated by reference in its entirety.

BACKGROUND

1. Technical Field

The inventive concept relates to multi-chip semiconductor device packages, such as a package-on-package (POP) type of semiconductor package, and to a method of manufacturing the same.

2. Discussion of the Related Art

As the electronics industry has evolved, high function, high speed, and compact electronic components have been increasingly in demand. In response to this trend, a plurality of stacked semiconductor chips has been mounted on a single package substrate or a semiconductor device package comprising ones or more chips has been stacked on another semiconductor device package. For example, with respect to the latter, a package-in-package (PIP) type semiconductor package and a package-on-package (POP) type semiconductor package have been developed.

The POP type semiconductor package typically includes an interposer disposed between and electrically connecting an upper package and a lower package. However, the use of an interposer may present several quality and reliability problems in the manufacture of a POP type semiconductor package.

SUMMARY

According to an aspect of the inventive concept, there is provided a package-on-package (POP) comprising a first package including a first substrate and a first semiconductor chip on the first substrate, a second package on the first package, the second package including a second substrate and a second semiconductor chip on the second substrate, an interposer between the first package and the second package, the interposer electrically connecting the first package and the second package, a first molded layer filling a space between the first package and the interposer, and a second molded layer covering an upper surface of the interposer.

According to another aspect of the inventive concept, there is provided a semiconductor device package comprising a first substrate, a first semiconductor chip on the first substrate, an interposer on the first semiconductor chip, the interposer electrically connected to the first substrate, a molded part including a first molded layer in which the first semiconductor chip is at least partially embedded and a second molded layer covering an upper surface of the interposer, a second substrate on the second molded layer, a second semiconductor chip on the second substrate, a first electrical connector extending through the first molded layer and electrically connecting the first substrate and the interposer, and a second electrical connector extending through the second molded layer. The second electrical connector electrically connects the interposer and the second substrate.

According to still another aspect of the inventive concept, there is provided a semiconductor device package comprising a first substrate, a first semiconductor chip on the first substrate, an interposer on the first semiconductor chip, a first connection part connecting the first substrate and the interposer, a first molding layer covering the first semiconductor chip and the first connection part, a second substrate on the interposer, a second connection part connecting the interposer and the second substrate, and a second molding layer covering a portion of a sidewall of the second connection part.

According to yet another aspect of the inventive concept, there is provided a semiconductor device package-on-package (PoP) comprising a first semiconductor device package, a second semiconductor device disposed on the first semiconductor package, an interposer interposed between the first semiconductor device package and the second semiconductor device package, a molded part molded around the interposer, and first and second electrical connectors extending through the molded part and electrically connected to the interposer and to the first and second semiconductor packages. The first semiconductor device package includes a first electronic substrate of the PoP, and a first semiconductor chip of the PoP disposed on and electrically connected to the first electronic substrate. The second semiconductor device package includes a second electronic substrate of the PoP and a second semiconductor chip of the PoP disposed on and electrically connected to the second electronic substrate. The interposer consists of an insulating substrate having lower and upper surfaces facing the first and second semiconductor device packages, respectively, and redistribution wiring. The redistribution wiring comprises a first electrically conductive pattern exposed with respect to the interposer at the lower surface of the insulating substrate and a second electrically conductive pattern exposed with respect to the interposer at the upper surface of the insulating substrate and electrically connected to the first electrically conducive pattern. The molded part includes a first molded layer in which the semiconductor chip of the first semiconductor device package is at least partially embedded and a second molded layer between an upper surface of the insulating substrate of the interposer and the second semiconductor device package. The first electrical connector extends through the first molded layer and electrically connects the first electrically conductive pad of the interposer to the first electronic substrate. the second electrical connector extends through the second molded layer and electrically connects the second electrically conductive pad of the interposer to the second electronic substrate. The first molded layer covers the lower surface of the insulating substrate of the interposer and the second molded layer covers the upper surface of the insulating substrate of the interposer. Also, the first molded layer and the second molded layer on opposite sides of the interposer have the same footprint According to another aspect of the inventive concept, there is also provided a method of manufacturing a semiconductor device package-on package (PoP), comprising providing a first package including a first substrate and a first semiconductor chip mounted on the first substrate, forming an interposer on the first semiconductor chip to be connected to the first substrate, forming a molding part to fill a space between the first package and the interposer and cover an upper surface of the interposer, and forming a second package on the molding part to be connected to the interposer.

BRIEF DESCRIPTION OF THE DRAWINGS

FIGS. 7, 8, 9, 10, 11, 12, 13 and 14 are cross-sectional views of an example of a package-on-package (POP) type semiconductor package during the course of its manufacture, illustrating an example of a method of manufacturing a package-on-package (POP) type semiconductor package according to the inventive concept.

FIGS. 15, 16 and 17 are cross-sectional views of an example of a package-on-package (POP) type semiconductor package during the course of its manufacture, illustrating another example of a method for manufacturing package-on-package (POP) type semiconductor package according to the inventive concept.

DETAILED DESCRIPTION

Various examples of the inventive concept will now be described more fully with reference to the accompanying drawings. However, the inventive concept may be embodied in many alternate forms and should not be construed as limited to only the examples set forth herein.

Figure 1:
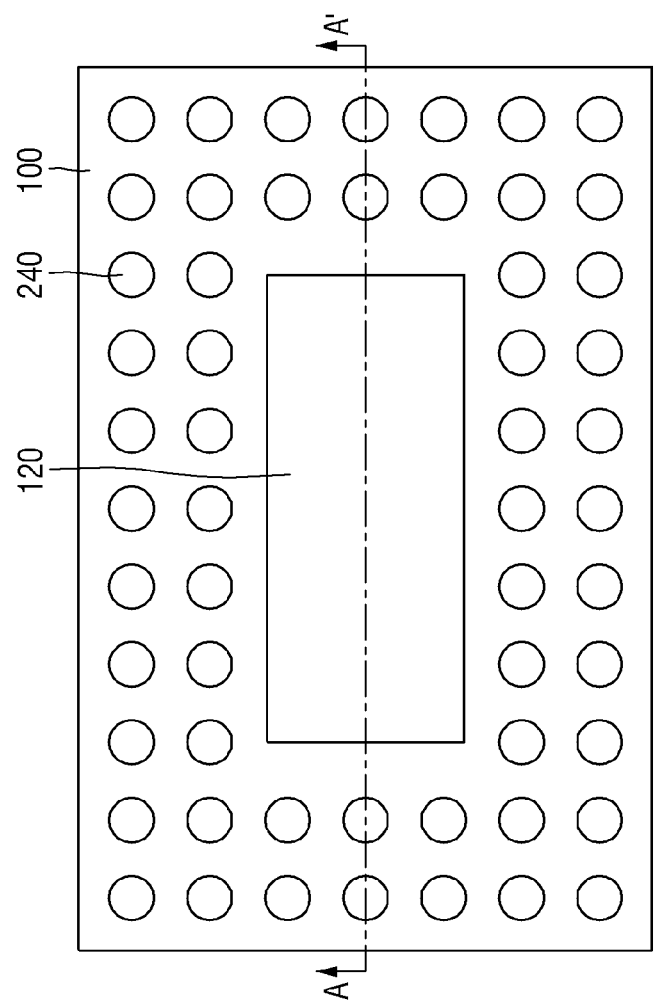
FIG. 1 is a layout diagram of package-on-package (POP) type semiconductor packages according to the inventive concept.

FIG. 1 is a layout diagram applicable to various examples of a package-on-package (POP) type semiconductor package according to the inventive concept.

Figure 2:
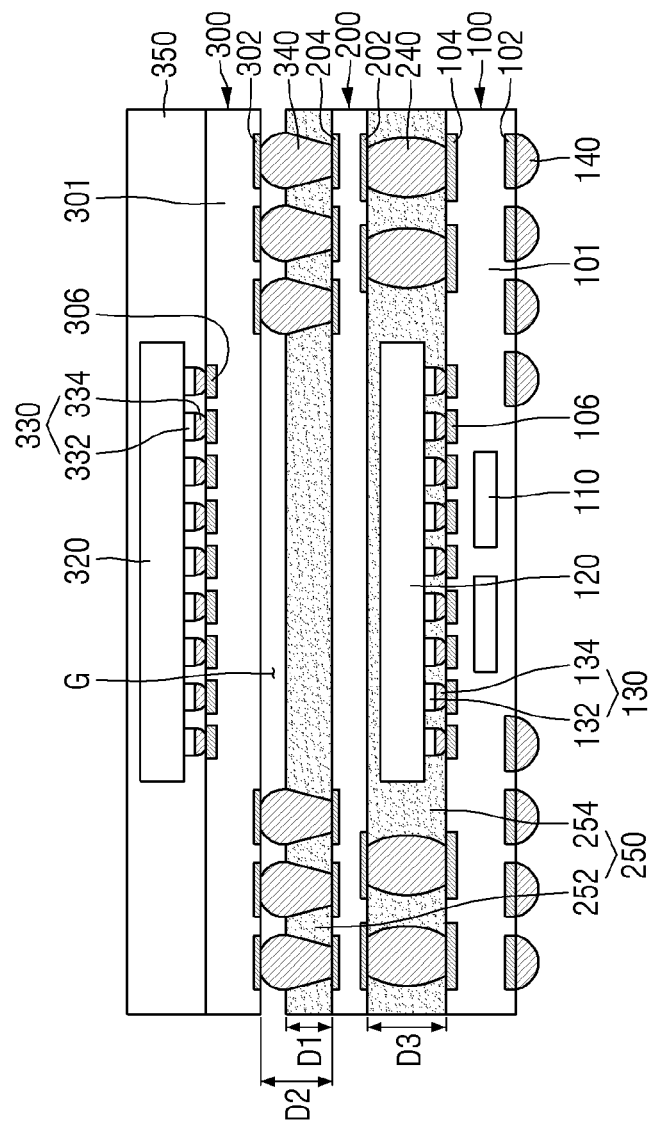
FIG. 2 is a cross-sectional view of an example of a package-on-package (POP) type semiconductor package according to the inventive concept as taken along line A-A' of FIG. 1.

FIG. 2 is a cross-sectional view of one such example, taken along line A-A' of FIG. 1.

Referring to FIGS. 1 and 2, a POP type semiconductor package according to the inventive concept may include a first package 100, an interposer 200, a second package 300, a first molding part 250, and a second molding part 350. The term "molding" as used herein may be understood as referring to a molded part or layer, i.e., a part of layer that is formed by having been molded.

The first package 100 may include a first substrate 101 and a first semiconductor chip 120.

The first substrate 101 may be a package substrate. For example, the first substrate 101 may be a printed circuit board (PCB) or a ceramic substrate. The first substrate 101 may include a single insulating layer or multiple insulating and wiring layers. The first substrate 101 may have an upper surface and a lower surface that are opposite to each other.

A first lower conductive pattern 102, a first upper conductive pattern 104, and a first connection pad 106 may be disposed on the first substrate 101. For example, the first lower conductive pattern 102 may be disposed on the lower surface of the first substrate 101, and the first upper conductive pattern 104 and the first connection pad 106 may be disposed on the upper surface of the first substrate 101. Thus, the insulating layer(s) of the first substrate 101 and wiring (including conductive patterns, pads 102, 104, 106, etc.) of the first substrate 101 constitute an electronic substrate.

The first lower conductive pattern 102, the first upper conductive pattern 104, and the first connection pad 106 may be connected to a wiring pattern of an electrical circuit, for example, in the first substrate 101. The first lower conductive pattern 102, the first upper conductive pattern 104, and the first connection pad 106 may be conductive elements (traces or pads) through which the wiring pattern of the first substrate 101 may be connected to the outside.

In some examples, the first substrate 101 contains a circuit element 110 (electronic component(s)). The circuit element 110 may comprise one or more active electronic components, e.g., a transistor, and/or one or more passive electronic components, e.g., at least one capacitor, resistor, or inductor. FIG. 2 illustrates that the circuit element 110 is disposed in the first substrate 101, but the inventive concept is not limited thereto. Rather, the circuit element 110 may be disposed on the upper surface or the lower surface of the first substrate 101.

A connection terminal 140 may be disposed on the lower surface of the first substrate 101. For example, the connection terminal 140 may be adhered to the first lower conductive pattern 102. The connection terminal 140 may have a spherical shape or a ball shape but is not limited thereto.

The connection terminal 140 may electrically connect the first package 100 to an external device. Thus, the connection terminal 140 may provide an electrical signal to the first package 100 and/or may provide an electrical signal output from the first package 100 to the external device.

The connection terminal 140 may be formed of at least one material selected from the group consisting of tin (Sn), lead (Pb), nickel (Ni), gold (Au), silver (Ag), copper (Cu), and bismuth (Bi).

A first semiconductor chip 120 may be mounted on the first substrate 101. In some examples, the first semiconductor chip 120 is a non-memory chip, e.g., a logic chip. For example, the first semiconductor chip 120 may be an application processor (AP).

In the illustrated example, only one semiconductor chip is disposed on the first substrate 101 but the inventive concept is not limited thereto. For example, a plurality of semiconductor chips may be disposed side by side on the first substrate 101 or may be sequentially stacked on the first substrate 101.

In some examples, the first semiconductor chip 120 is mounted on the first substrate 101 by a flip chip bonding method. For example, a first bump structure 130 may be interposed between the first substrate 101 and the first semiconductor chip 120 to electrically connect the first substrate 101 and the first semiconductor chip 120.

In some examples, the first bump structure 130 may include a first pillar structure 132 and a first solder layer 134.

The first pillar structure 132 may protrude from a lower surface of the first semiconductor chip 120. The first pillar structure 132 may be connected to the first semiconductor chip 120. The first pillar structure 132 may be formed of at least one material selected from the group consisting of copper (Cu), copper alloy, nickel (Ni), nickel alloy, palladium (Pd), platinum (Pt), gold (Au), and cobalt (Co), but is not limited thereto.

The first solder layer 134 may be disposed between the first pillar structure 132 and the first substrate 101. The first solder layer 134 may connect the first pillar structure 132 and the first connection pad 106. The first solder layer 134 may have a spherical shape or a ball shape but is not limited thereto. The first solder layer 134 may comprise at least one material selected from the group consisting of tin (Sn), indium (In), bismuth (Bi), antimony (Sb), copper (Cu), silver (Ag), zinc (Zn), and lead (Pb), but is not limited thereto.

The interposer 200 is interposed between the first package 100 and the second package 300. The (insulating substrate of the) interposer 200 has an upper surface and a lower surface that are opposite to each other. The first package 100 and the second package 300 may be easily connected to each other by the interposer 200. The interposer 200 may prevent the first and second packages 100 and 300 from warping.

The interposer 200 may include a second lower conductive pattern 202 and a second upper conductive pattern 204. For example, the second lower conductive pattern 202 may be disposed on the lower surface of (the insulating substrate of) the interposer 200, and the second upper conductive pattern 204 may be disposed on the upper surface of (the insulating substrate of) the interposer 200.

The second lower conductive pattern 202 and the second upper conductive pattern 204 are connected to a wiring pattern in the insulating substrate of the interposer 200. The second lower conductive pattern 202 and the second upper conductive pattern 204 may be conducive elements (e.g., traces or pads) through which the wiring pattern of the interposer 200 may be connected to the outside. The second lower conductive pattern 202, the second upper conductive pattern 204 and the wiring pattern may be considered as constituting distribution wiring. Thus, the interposer 200 may consist of on insulating substrate and redistribution wiring through which signals are transferred through the insulating substrate.

In some examples, the interposer 200 is connected to the first substrate 101 by a first connection part 240 comprising electrical connectors. The first connection part 240 may be disposed between the first substrate 101 and the interposer 200 to electrically connect the first substrate 101 and the interposer 200. For example, the first connection part 240 may electrically connect the first upper conductive pattern 104 and the second lower conductive pattern 202. In some examples, as shown in FIG. 1, a plurality of electrical connectors of the first connection part 240 surrounds the first semiconductor chip 120, in a plan view.

The first connection part 240 may comprise at least one material selected from the group consisting of tin (Sn), indium (In), bismuth (Bi), antimony (Sb), copper (Cu), silver (Ag), zinc (Zn), and lead (Pb), but is not limited thereto.

In the example illustrated in FIG. 2, the interposer 200 is spaced from the first semiconductor chip 120, but the inventive concept is not limited thereto. For example, the interposer 200 may contact the first semiconductor chip 120 depending on a size of the first connection part 240.

The second package 300 may be disposed on the interposer 200. The second package 300 may include a second substrate 301 and a second semiconductor chip 320.

The second substrate 301 may be a package substrate. For example, the second substrate 301 may be a printed circuit board (PCB) or a ceramic substrate. The second substrate 301 may include a single insulating layer or multiple insulating and wiring layers. The second substrate 301 may have an upper surface and a lower surface that are opposite to each other.

A third lower conductive pattern 302 and a second connection pad 306 may be disposed on the second substrate 301. For example, the third lower conductive pattern 302 may be disposed on the lower surface of the second substrate 301, and the second connection pad 306 may be disposed on the upper surface of the second substrate 301. Thus, the insulating layer(s) of the second substrate 301 and wiring (including conductive patterns, pads 302, 306, etc.) of the second substrate 301 constitute an electronic substrate.

The third lower conductive pattern 302 and the second connection pad 306 may be connected to a wiring pattern, e.g. a wiring pattern of an electrical circuit, in the second substrate 301. The third lower conductive pattern 302 and the second connection pad 306 may be conductive elements (e.g., traces or pads) through which the wiring pattern of the second substrate 301 may be connected to the outside.

In some examples, the second substrate 301 is connected to interposer 200 by a second connection part 340 comprising electrical connectors. The second connection part 340 may be disposed between the second substrate 301 and the interposer 200 to electrically connect the second substrate 301 and the interposer 200. For example, the second connection part 340 may electrically connect the second upper conductive pattern 204 and the third lower conductive pattern 302.

The second connection part 340 may comprise at least one material selected from the group consisting of tin (Sn), indium (In), bismuth (Bi), antimony (Sb), copper (Cu), silver (Ag), zinc (Zn), and lead (Pb), but is not limited thereto.

A second semiconductor chip 320 may be mounted on the second substrate 301. In some examples, the second semiconductor chip 320 is a memory chip.

In the illustrated example, only one semiconductor chip is disposed on the second substrate 301, but the inventive concept is not limited thereto. For example, a plurality of semiconductor chips may be disposed side by side on the second substrate 301 or may be sequentially stacked on the second substrate 301.

In some examples, the second semiconductor chip 320 is mounted on the second substrate 301 by a second bump structure 330. The second bump structure 330 may be disposed between the second substrate 301 and the second semiconductor chip 320 to electrically connect the second substrate 301 and the second semiconductor chip 320. In some examples, the second bump structure 330 includes a second pillar structure 332 and a second solder layer 334. The second bump structure 330 may be similar to the first bump structure 130. Thus, detailed descriptions of the second bump structure 330 will be omitted for the sake of brevity.

The first molding part 250 may cover the lower surface and the upper surface of the interposer 200. For example, the first molding part 250 may include a first molding layer 254 between the first package 100 and the interposer 200 and a second molding layer 252 between the interposer 200 and the second package 300. The first and second molding layers 254, 252 may have the same footprint, i.e., outer peripheries of the same size and shape as viewed in a plan view.

In some examples, the first molding part 250 exposes sides (side edges) of the interposer 200. For example, the first molding layer 254 and the second molding layer 252 may be spaced apart from each other by the interposer 200.

The first molding layer 254 may fill a space between the first package 100 and the interposer 200. That is, the first molding layer 254 may extend from the upper surface of the first substrate 101 to the lower surface of the interposer 200. Accordingly, the first molding layer 254 may cover the first semiconductor chip 120 and the first connection part 240.

In this case, the first connection part 240 penetrates (extends through) the first molding layer 254 to electrically connect the first upper conductive pattern 104 and the second lower conductive pattern 202. The first molding layer 254 may completely cover the circumferential side surface of the first connection part 240.

In the example of FIG. 2, the first molding layer 254 is interposed between the first semiconductor chip 120 and the interposer 200, but the inventive concept is not limited thereto. For example, the first semiconductor chip 120 may contact the interposer 200, and thus no portion of the first molding layer 254 is interposed between the first semiconductor chip 120 and the interposer 200.

The second molding layer 252 may cover the upper surface of the interposer 200. For example, the second molding layer 252 may extend upward from the upper surface of the interposer 200.

In some examples, a thickness of the second molding layer 252 is smaller than a distance between the interposer 200 and the second substrate 301. For example, as shown in FIG. 2, a first distance D1 from the upper surface of the interposer 200 to an upper surface of the second molding layer 252 is smaller than a second distance D2 from the upper surface of the interposer 200 to the lower surface of the second substrate 301. The second molding layer 252 may not contact the second substrate 301. Thus, a gap G may be formed between the second molding layer 252 and the second substrate 301.

In some examples, the gap G may be filled with another insulation material e.g., an underfill material.

The second connection part 340 may penetrate (extend through) the second molding layer 252 to electrically connect the second upper conductive pattern 204 and the third lower conductive pattern 302. In some examples, the second connection part 340 protrudes above the upper surface of the second molding layer 252. For example, the second molding layer 252 may cover a portion only of the outer circumferential side surface of the second connection part 340.

In some examples, the first molding layer 254 is thicker than the second molding layer 252. For example, a third distance D3 from the upper surface of the first substrate 101 to the lower surface of the interposer 200 is greater than the first distance D1 from the upper surface of the interposer 200 to the upper surface of the second molding layer 252. However, the inventive concept is not limited thereto. For example, the third distance D3 may be smaller than the first distance D1 depending on a size of the first connection part 240 or a size of the first semiconductor chip 120.

The first molding part 250 comprises an insulating material. For example, the first molding part 250 comprises an insulating polymer material such as an epoxy molding compound (EMC).

In some examples, the first molding layer 254 and the second molding layer 252 may be concurrently formed. That is, the first molding layer 254 and the second molding layer 252 may be formed by the same manufacturing process. Thus, the first molding layer 254 and the second molding layer 252 may be formed of the same material. For example, the first molding layer 254 and the second molding layer 252 may both be formed of the same EMC.

The second molding part 350 may be disposed on the second substrate 301. The second molding part 350 may cover the second semiconductor chip 320. The second molding part 350 comprises an insulating material. For example, the second molding part 350 comprises an insulating polymer material such as an EMC. The second molding part 350 may be of substantially the same material as the first molding part 250, but the inventive concept is not limited thereto. That is, the second molding part 350 may include a material different from that constituting the first molding part 250.

In the POP type semiconductor package according to the inventive concept, the first molding part 250 may act as an adhesive for bonding the first package 100 to the interposer 200. Because the first molding part 250 covers the lower surface and the upper surface of the interposer 200, warping of the interposer 200 may be reduced or prevented. Also, in a case in which the first molding layer 254 and the second molding layer 252 are concurrently formed, a flow balance of the material (e.g., EMC) formed on the lower surface and the upper surface of the interposer 200 may be efficiently maintained.

In addition, because the second molding layer 252 is interposed between the interposer 200 and the second substrate 301, the thickness of the POP type semiconductor package may be kept to a minimum. Thus, a miniaturized POP type semiconductor may be provided.

Figure 3:
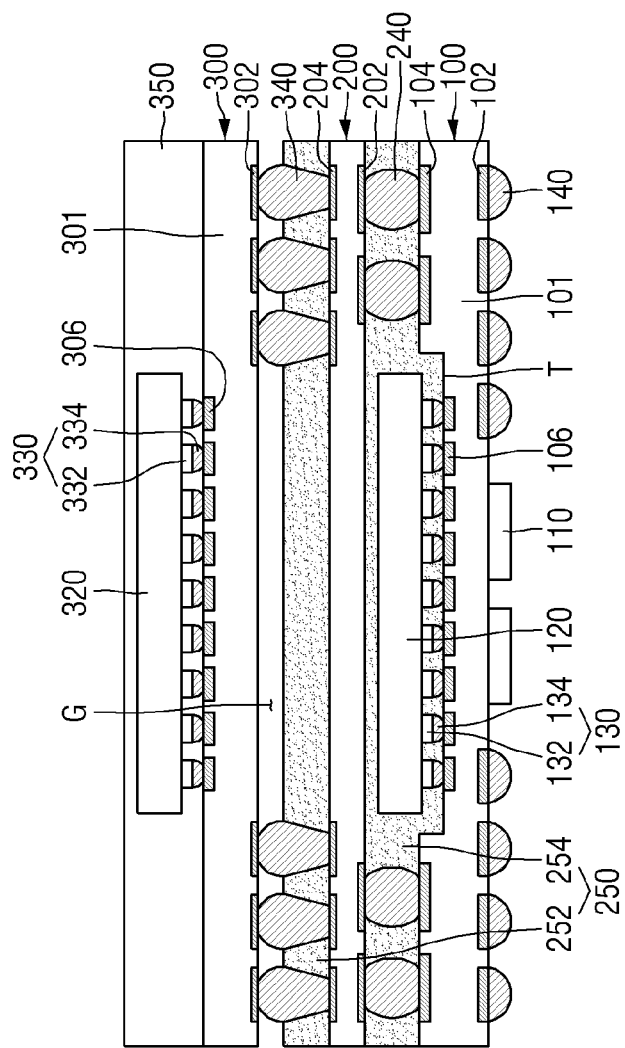
FIG. 3 is a cross-sectional view of another example of a package-on-package (POP) type semiconductor package according to the inventive concept as taken along line A-A' of FIG. 1.

FIG. 3 is a cross-sectional view of another example of a package-on-package (POP) type semiconductor package according to the inventive concept. The same elements as those described with reference to FIGS. 1 and 2 will only be briefly described again or not described at all, for the sake of brevity.

Referring to FIG. 3, in a POP type semiconductor package according to the inventive concept, the first substrate 101 may include a trench T.

The trench T may be formed in an upper portion of the first substrate 101. In some examples, the first semiconductor chip 120 is disposed on a surface defining the bottom of the trench T. For example, the first connection pad 106 may be disposed at the bottom of the trench T. In addition, the first bump structure 130 may electrically connect the first connection pad 106 and the first semiconductor chip 120.

Thus, the distance between the first substrate 101 and the interposer 200 may be minimized.

In some examples, the circuit element 110 is disposed on the lower surface of the first substrate 101 because the first substrate 101 in which the trench T is formed may lack the necessary space for the circuit element 110. The circuit element 110 may be disposed on a portion of the lower surface of the first substrate 101 vertically juxtaposed with the trench T. In some examples, the circuit element 110 on the lower surface of the first substrate 101 is a passive element, e.g., a capacitor, a resistor, or an inductor.

Figure 4:
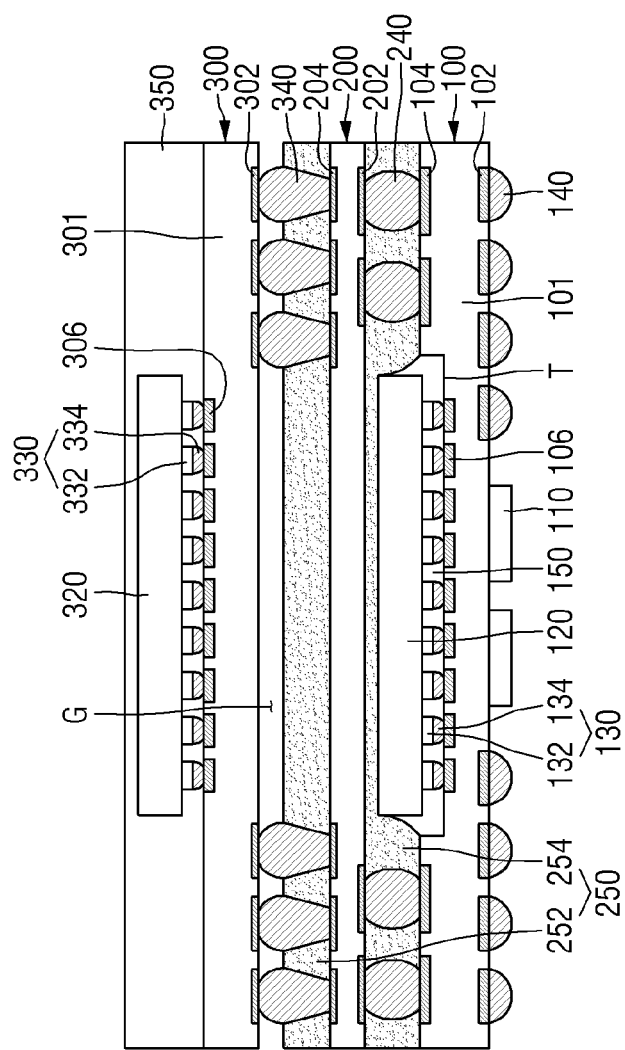
FIG. 4 is a cross-sectional view of another example of a package-on-package (POP) type semiconductor package according to the inventive concept as taken along line A-A' of FIG. 1

FIG. 4 is a cross-sectional view of another example of a package-on-package (POP) type semiconductor package according to the inventive concept. The same elements as those described with reference to FIGS. 1-3 will only be briefly described again or not described at all, for the sake of brevity.

Referring to FIG. 4, in this example of a POP type semiconductor package according to the inventive concept, the first package 100 includes an underfill 150.

The underfill 150 may fill a space between the first substrate 101 and the first semiconductor chip 120. The underfill 150 may fix the first semiconductor chip 120 on the first substrate 101, thus preventing the first semiconductor chip 120 from being broken.

The underfill 150 may cover the first bump structure 130. The first bump structure 130 may penetrate (extend through) the underfill 150 to electrically connect the first connection pad 106 and the first semiconductor chip 120.

The underfill 150 comprises an insulation material. For example, the underfill 150 comprises an insulating polymer material such as an EMC. In some examples, the underfill 150 is of material different from that of the first molding layer 254. For example, the underfill 150 may include an insulating material having a higher fluidity than that of the first molding layer 254. Thus, the underfill 150 may efficiently fill a narrow space between the first substrate 101 and the first semiconductor chip 120.

At least a portion of the underfill 150 may fill the trench T of the first substrate 101. However, the inventive concept is not limited thereto. In some examples, the first substrate 101 does not include the trench T. In that case, the underfill 150 may be formed to cover a portion of the upper surface of the first substrate 101 and to contact the first semiconductor chip 120.

Figure 5:
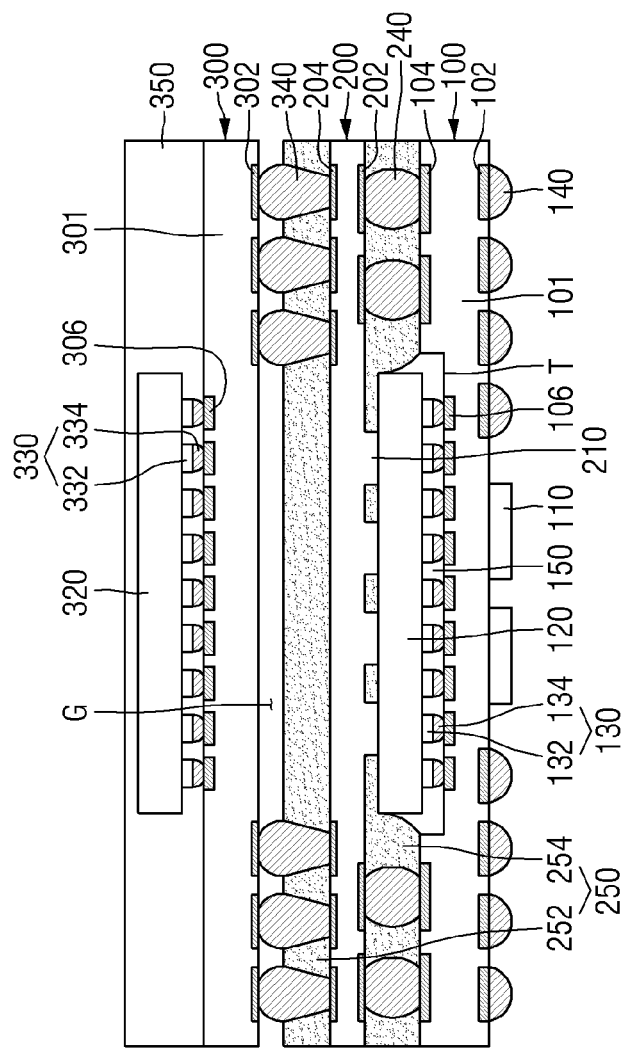
FIG. 5 is a cross-sectional view of another example of a package-on-package (POP) type semiconductor package according to the inventive concept as taken along line A-A' of FIG. 1

FIG. 5 is a cross-sectional view of still another example of a package-on-package (POP) type semiconductor package according to the inventive concept. The same elements as those described with reference to FIGS. 1-4 will only be briefly described again or not described at all, for the sake of brevity.

Referring to FIG. 5, in this example of a POP type semiconductor package according to the inventive concept, the interposer 200 includes a supporter 210.

The supporter 210 protrudes downward from a lower surface of the interposer 200 to face the upper surface of the first semiconductor chip 120. The supporter 210 may support the interposer 200 over the first semiconductor chip 120. Thus, the interposer 200 may be prevented from being bent.

A plurality of supporters 210 may be formed. Four supporters 210 are illustrated in FIG. 5. However, the inventive concept is not limited thereto. That is, five or more supporters 210 or three or less supporters 210 may be formed.

In the example of FIG. 5, all of the supporters 210 contact an upper surface of the first semiconductor chip 120, but the inventive concept is not limited thereto. Depending on a size of the first connection part 240, some of the supporters 210 may be spaced apart from the upper surface of the first semiconductor chip 120.

Figure 6:
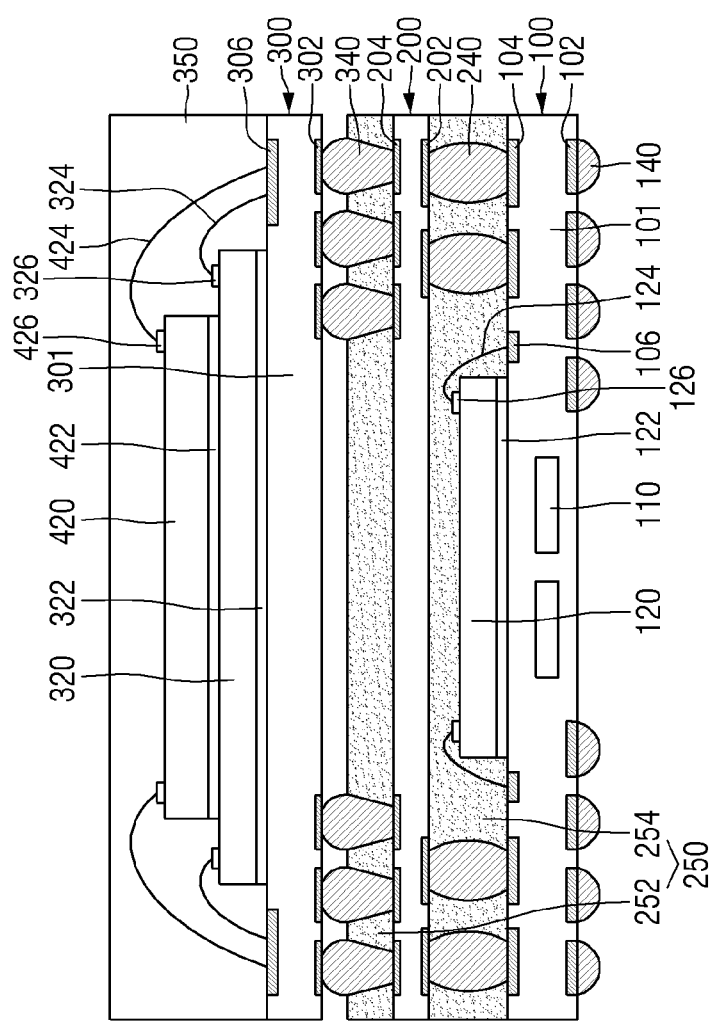
FIG. 6 is a cross-sectional view of another example of a package-on-package (POP) type semiconductor package according to the inventive concept as taken along line A-A' of FIG. 1.

FIG. 6 is a cross-sectional view of still another example of a package-on-package (POP) type semiconductor package according to the inventive concept. The same elements as those described with reference to FIGS. 1 and 2 will only be briefly described again or not described at all, for the sake of brevity.

In this example of a POP semiconductor package according to the inventive concept, the first semiconductor chip 120 is mounted on the first substrate 101 by any of various methods other than a flip chip bonding method.

For example, referring to FIG. 6, the first semiconductor chip 120 may be mounted on the first substrate 101 by a first adhesive part 122. A lower surface of the first semiconductor chip 120 may be adhered to an upper surface of the first substrate 101 by the first adhesive part 122. The first adhesive part 122 may comprise a liquid epoxy resin, an adhesive tape, a conductive medium, or combinations thereof, but is not limited thereto.

In some examples, the first semiconductor chip 120 may be connected to the first substrate 101 by a first bonding wire 124. For example, the first bonding wire 124 may electrically connect a first chip pad 126 on an upper surface of the first semiconductor chip 120 to the first connection pad 106. However, the inventive concept is not limited thereto. For example, the first semiconductor chip 120 may instead be electrically connected to the first connection pad 106 by a bonding tape.

The second semiconductor chip 320 may be mounted on the second substrate 301 by various methods.

For example, as shown in FIG. 6, the second semiconductor chip 320 may be mounted on the second substrate 301 by a second adhesive part 322. A lower surface of the second semiconductor chip 320 may be adhered to an upper surface of the second substrate 301 by the second adhesive part 322. The second semiconductor chip 320 may be connected to the second substrate 301 by a second bonding wire 324. For example, the second bonding wire 324 may connect a second chip pad 326 of the second semiconductor chip 320 and the second connection pad 306 of the second substrate 301.

In some examples, a plurality of semiconductor chips may be stacked on the first substrate 101 or on the second substrate 301. For example, a third semiconductor chip 420 may be stacked on the second semiconductor chip 320.

Still referring to FIG. 6, the third semiconductor chip 420 may be mounted on the second semiconductor chip 320 by a third adhesive part 422. A lower surface of the third semiconductor chip 420 may be adhered to an upper surface of the second semiconductor chip 320 by the third adhesive part 422. The third semiconductor chip 420 may be connected to the second substrate 301 by a third bonding wire 424. For example, the third bonding wire 424 may connect a third chip pad 426 of the third semiconductor chip 420 and the second connection pad 306 of the second substrate 301.

FIGS. 7 to 14 are views illustrating stages in a method of manufacturing a package-on-package (POP) type semiconductor package according to the inventive concept. The same elements as those described with reference to FIGS. 1 and 2 may only be briefly described again or not described at all, for the sake of brevity.

Figure 7:
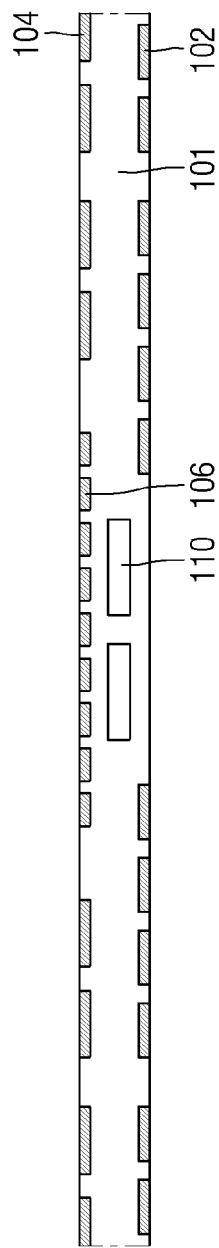

Referring to FIG. 7, the first substrate 101 may be provided.

The first substrate 101 may be a package substrate. For example, the first substrate 101 may be a printed circuit board (PCB) or a ceramic substrate.

The first lower conductive pattern 102, the first upper conductive pattern 104, and a first connection pad 106 may be disposed on the first substrate 101. For example, the first lower conductive pattern 102 may be disposed on a lower surface of the first substrate 101. The first upper conductive pattern 104 and the first connection pad 106 may be disposed on an upper surface of the first substrate 101.

In some examples, the circuit element 110 is formed integral with the first substrate 101. The circuit element 110 may comprise an active electronic component, e.g., a transistor, or a passive electronic component, e.g., a capacitor, a resistor, or an inductor.

Figure 8:
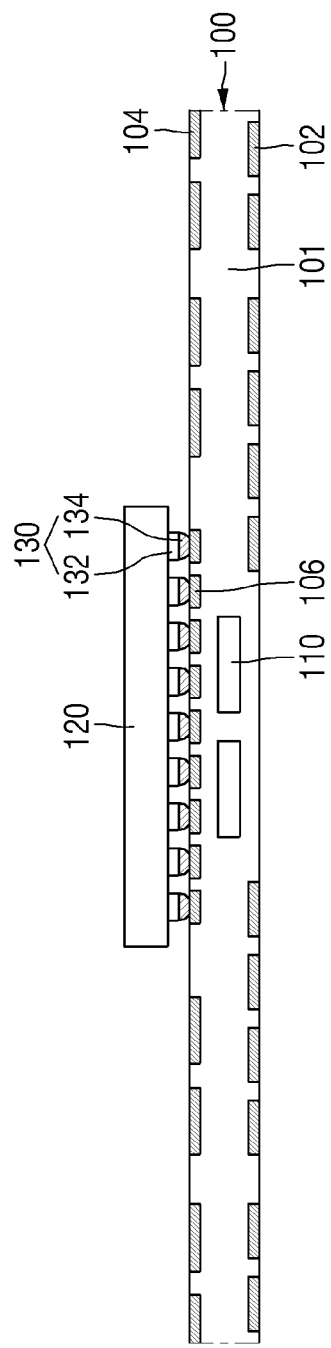

Referring to FIG. 8, the first semiconductor chip 120 may be mounted on the first substrate 101. For example, the first semiconductor chip 120 on which the first bump structure 130 is formed may be mounted on the first substrate 101. Thus, the first substrate 101 and the first semiconductor chip 120 may be electrically connected to each other. Thus, the first package 100 including the first substrate 101 and the first semiconductor chip 120 may be formed.

In some examples, the first bump structure 130 may include the first pillar structure 132 and the first solder layer 134.

Figure 9:
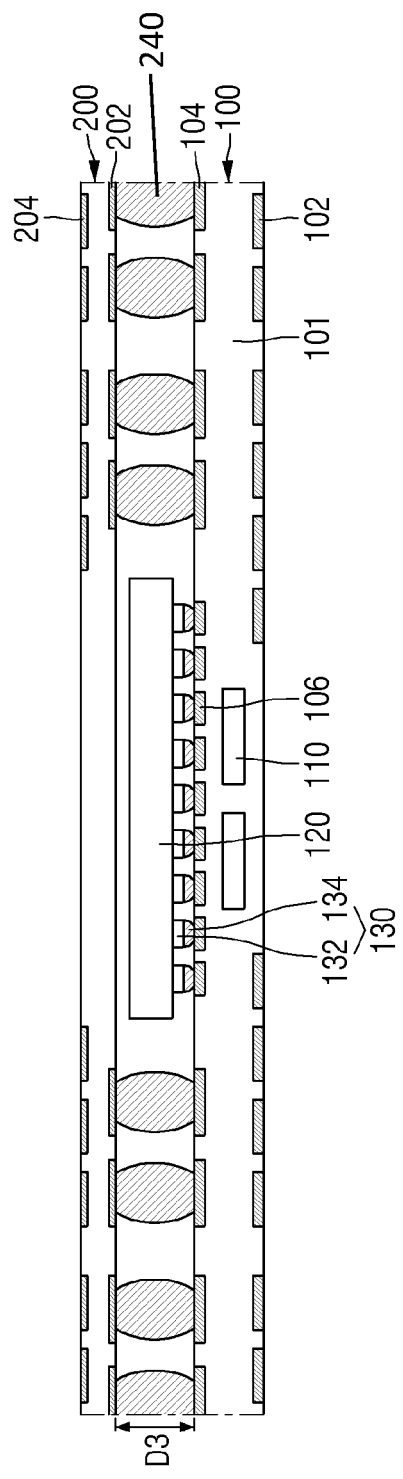

Referring to FIG. 9, the interposer 200 may be provided on the first package 100. Here, and in the description that follows, the term "provided" may be understood as meaning assembled to or packaged with, etc.

The interposer 200 may include the second lower conductive pattern 202 and the second upper conductive pattern 204. For example, the second lower conductive pattern 202 may be disposed on a lower surface of the interposer 200. The second upper conductive pattern 204 may be disposed on an upper surface of the interposer 200.

The interposer 200 may be formed to be connected to the first substrate 101. For example, the first connection part 240 may be formed on the first upper conductive pattern 104, and then the interposer 200 may be formed such that the second lower conductive pattern 202 of the interposer 200 is connected to the first connection part 240. Thus, the first connection part 240 may electrically connect the first substrate 101 and the interposer 200.

In some examples, the interposer 200 is spaced from the first semiconductor chip 120. For example, a height (e.g., a third distance D3) of the first connection part 240 may be greater than a distance from the upper surface of the first substrate 101 to an upper surface of the first semiconductor chip 120. However, the inventive concept is not limited thereto. For example, depending on the size of the first connection part 240, the interposer 200 may contact the first semiconductor chip 120.

Figure 10:
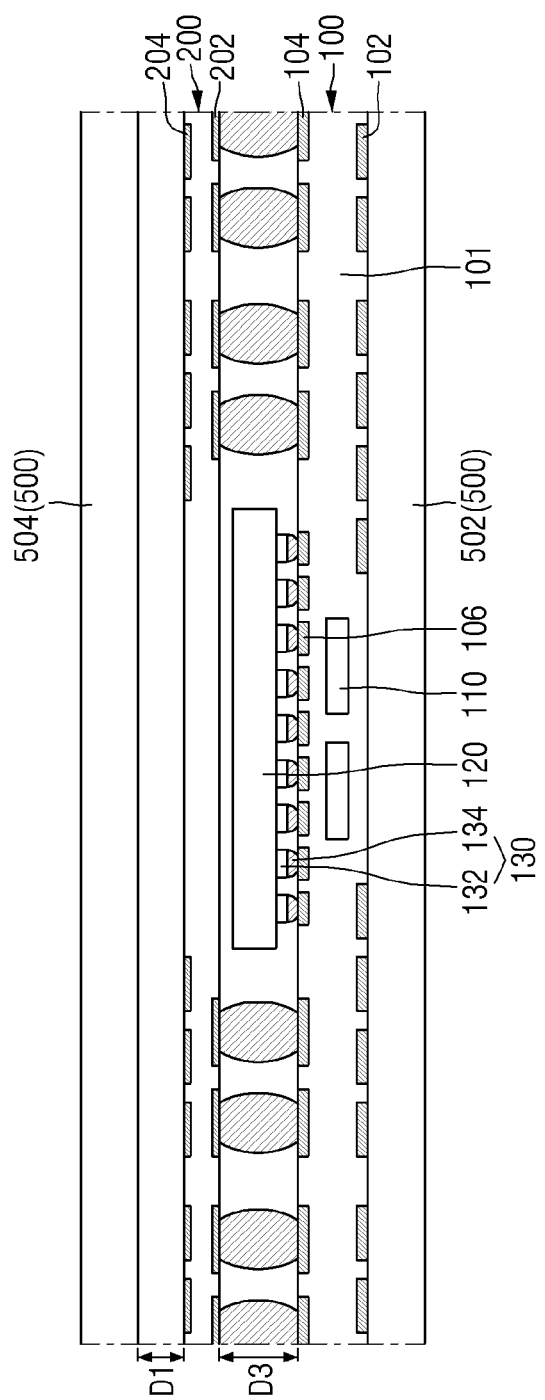

Referring to FIG. 10, the first substrate 101 and the interposer 200 may be inserted into a mold 500.

The mold 500 may include a first mold section (or half) 502 and a second mold section (or half) 504. The first mold section 502 may contact the lower surface of the first substrate 101. The second mold section 504 may be disposed over the interposer 200 as spaced apart from the interposer 200. The second mold section 504 may be spaced apart from the upper surface of the interposer 200 by a first distance D1.

The mold 500 may be a metal mold but is not limited thereto.

Figure 11:
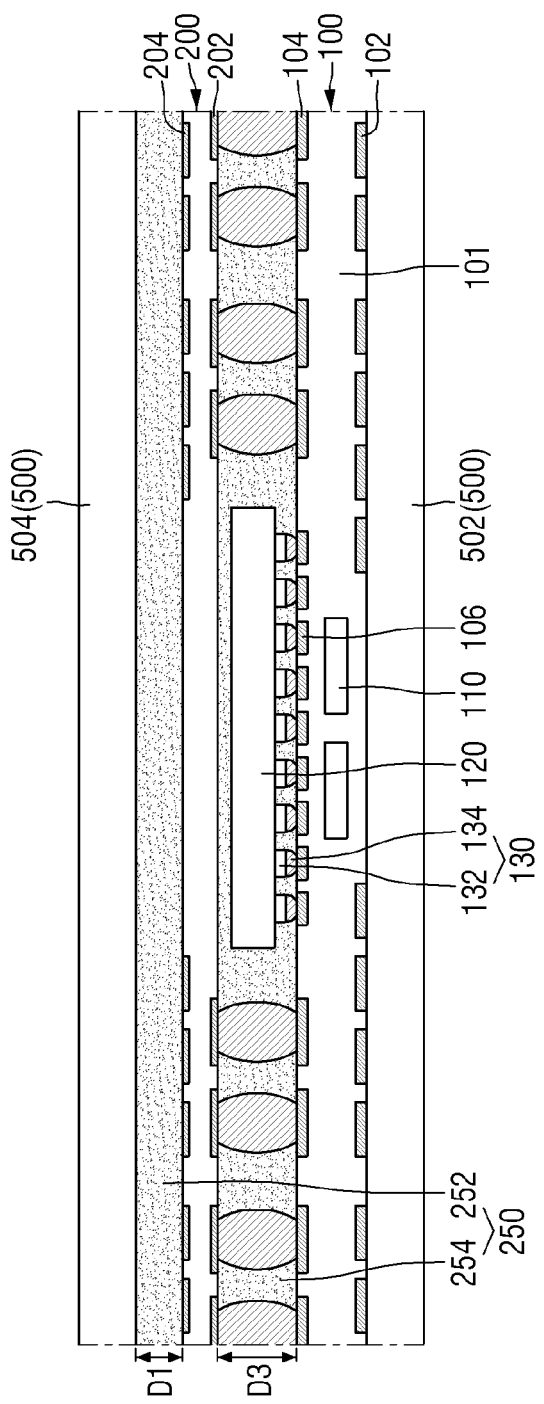

Referring to FIG. 11, the first molding part 250 may be formed using the mold 500. For example, a molding material may be injected between the first mold section 502 and the second mold section 504. The molding material may be an insulating polymer material, e.g., an EMC.

Thus, the first molding layer 254 may be formed to fill a space between the first package 100 and the interposer 200. In addition, the second molding layer 252 may be formed to fill a space between the interposer 200 and the second mold 504. In other words, the first molding part 250 may be formed to cover the lower surface and the upper surface of the interposer 200. Because the second molding layer 252 is formed to fill the space between the interposer 200 and the second mold 504, a thickness of the second molding layer 252 may be substantially the same as the first distance D1.

Referring to FIG. 12, the first substrate 101 and the interposer 200 may be cut into unit packages For example, the first substrate 101 and the interposer 200 may be cut along the boundary of a region containing the first semiconductor chip 120. Thus, sides of the interposer 200 may be exposed and a unit package is thereby formed.

Before the first substrate 101 and the interposer 200 are cut into unit packages, the mold 500 may be removed.

The first substrate 101, etc., may be cut into unit packages after the first molding part 250 is formed, but the inventive concept is not limited thereto. The first substrate 101, etc., may be cut into unit packages at various process stages. For example, the first substrate 101, etc., may be cut into unit packages after the second package 300 is formed.

Referring to FIG. 13, a hole H may be formed to expose the upper surface of the interposer 200.

For example, the hole H may be formed to expose an upper surface of the second upper conductive pattern 204. The hole H may have a tapered shape depending on characteristics of a process for forming the hole H.

The hole H may be formed by a laser drilling process. For example, the second molding layer 252 on the second upper conductive pattern 204 may be repeatedly irradiated with a laser to form the hole H exposing the upper surface of the second upper conductive pattern 204.

Referring to FIG. 14, the second connection part 340 may be formed to fill the hole H.

The second connection part 340 may be formed to protrude above an upper surface of the second molding layer 252. The second molding layer 252 may cover a portion of the outer circumferential surface of the second connection part 340.

Referring again to FIG. 2, the second package 300 and the second molding part 350 may be subsequently formed on the second molding layer 252.

The second package 300 may be connected to the second connection part 340. For example, the third lower conductive pattern 302 of the second package 300 may be connected to the second connection part 340. Thus, the second connection part 340 may electrically connect the interposer 200 and the second substrate 301.

The second molding part 350 may be formed on the second substrate 301. In addition, the second molding part 350 may cover the second semiconductor chip 320. The second molding part 350 is formed of an insulation material. For example, the second molding part 350 is formed of an insulating polymer material, e.g., EMC.

Figure 16:
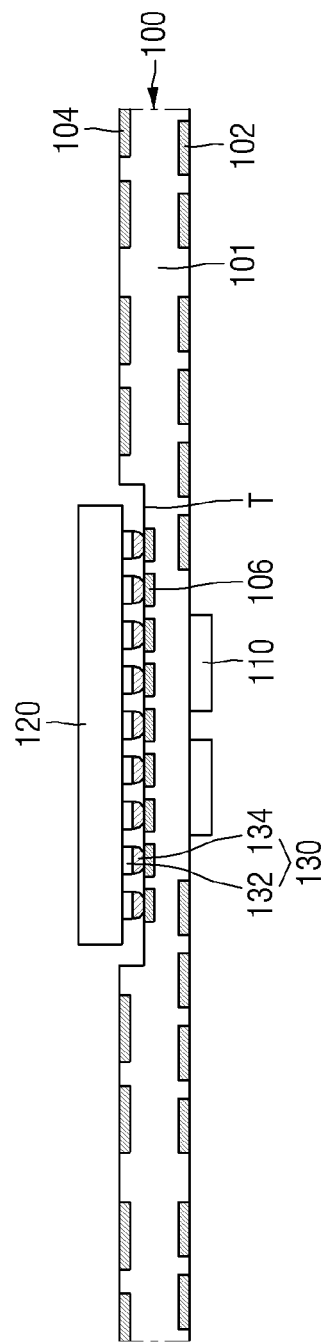
Figure 17:
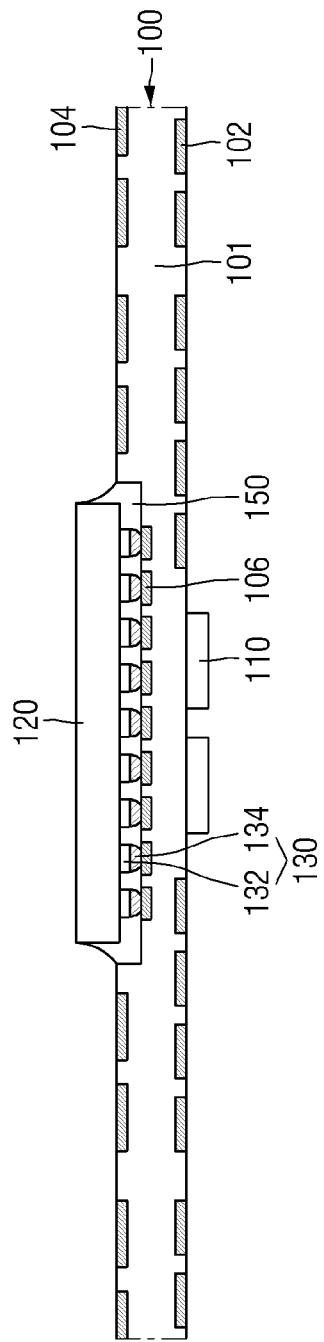

FIGS. 15 to 17 are views illustrating stages in another example of a method of manufacturing a package-on-package (POP) type semiconductor package according to the inventive concept. The same elements and stages as those described with reference to FIGS. 1-14 may only be briefly described again or not described at all, for the sake of brevity.

Referring to FIG. 15, the first substrate 101 including the trench T may be provided.

The trench T may be formed in an upper portion of the first substrate 101, for example. In some examples, the first connection pad 106 may be disposed on a surface of the first substrate 101 defining the bottom of the trench T.

In some examples, the circuit element 110 may be disposed on a lower surface of the first substrate 101. For example, the circuit element 110 may be disposed on a portion of the lower surface of the first substrate 101 vertically juxtaposed with the trench T. In some examples, the circuit element 110 is a passive electronic component, e.g., a capacitor, a resistor, or an inductor.

Referring to 16, the first semiconductor chip 120 may be mounted to the first substrate 101 at the bottom of the trench T.

For example, the first semiconductor chip 120 may be provided with the first bump structure 130. Next, the first bump structure 130 may be connected to the first connection pad 106. Thus, the first semiconductor chip 120 may be mounted in the trench T.

Referring to FIG. 17, the underfill 150 may be formed to fill a space between the first substrate 101 and the first semiconductor chip 120.

For example, the underfill 150 may be formed to fill the trench T. The underfill 150 may cover the first bump structure 130.

In some examples, the first substrate 101 does not have the trench T. In this case, the underfill 150 may be formed to cover a portion of an upper surface of the first substrate 101 and to contact the first semiconductor chip 120.

The underfill 150 may be an insulating polymer material, e.g., EMC. In some examples, the underfill 150 is an insulating material having a high fluidity. In some examples, the underfill 150 is omitted.

Referring again to FIG. 4, subsequently, the interposer 200, the first molding part 250, the second package 300, and the second molding part 350 may be sequentially provided on the first package 100.

The interposer 200, the first molding part 250, the second package 300, and the second molding part 350 may be provided in manners similar to those described with reference to FIGS. 2 and 9 to 14. Thus, such stages of the manufacturing method will not be described again in detail.

Figure 18:
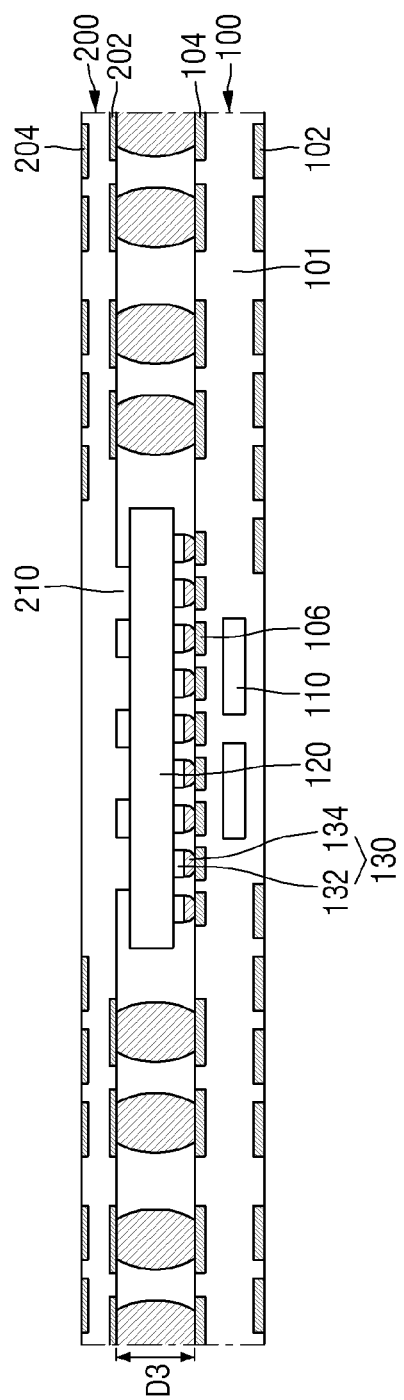
FIG. 18 is a cross-sectional view of an example of a package-on-package (POP) type semiconductor package during the course of its manufacture, in still another example of a method for manufacturing package-on-package (POP) type semiconductor package according to the inventive concept.

FIG. 18 is a view illustrating a stage in another example of a method of manufacturing package-on-package (POP) type semiconductor package according to the inventive concept. The same elements and stages as those described with reference to FIGS. 1-14 may only be briefly described again or not described at all, for the sake of brevity. FIG. 18 illustrates a process stage after the process stage shown in FIG. 8

Referring to FIG. 18, the interposer 200 including the supporter 210 may be provided on the first package 100.

The interposer 200 including the supporter 210 protruding from a lower surface of the interposer 200 may be provided on the first package 100. The supporter 210 of the interposer 200 may face an upper surface of the first semiconductor chip 120. For example, the interposer 200 may be formed such that the supporter 210 thereof contacts the upper surface of the first semiconductor chip 120.

Next, the first molding part 250, the second package 300, and the second molding part 350 may be sequentially provided.

The first molding part 250, the second package 300, and the second molding part 350 may be provided in manners similar to those described with reference to FIGS. 2 and 10 to 14. Thus, such stages of the manufacturing method will not be described again in detail.

Although the inventive concept has been particularly shown and described with reference to various examples thereof, it will be understood by those of ordinary skill in the art that various changes in form and details may be made to such examples without departing from the spirit and scope of the inventive concept as defined by the following claims.

What is claimed is:

1. A semiconductor device package-on-package (PoP) comprising:
    a first package including a first substrate and a first semiconductor chip on the first substrate;
    a second package on the first package, the second package including a second substrate and a second semiconductor chip on the second substrate;
    an interposer between the first package and the second package, the interposer electrically connecting the first package and the second package;
    a first molded layer filling a space between the first package and the interposer; and
    a second molded layer covering an upper surface of the interposer,
    wherein the second molded layer is spaced apart from the second substrate.

2. The semiconductor device PoP of claim 1, wherein the first molded layer and the second molded layer are of a same material.

3. The semiconductor device PoP of claim 1, wherein a thickness of the second molded layer is smaller than a distance between the interposer and the second substrate.

4. The semiconductor device PoP of claim 1, wherein the first substrate includes a trench having a bottom situated within the first substrate, and
    the first semiconductor chip is mounted on a surface of the first substrate defining the bottom of the trench.

5. The semiconductor device PoP of claim 4, wherein the first package further includes a passive electronic component, and
    the passive electronic component is disposed on a portion of a lower surface of the first substrate as vertically juxtaposed with the trench.

6. The semiconductor device PoP of claim 1, further comprising an underfill filling a space between the first substrate and the first semiconductor chip.

7. The semiconductor device PoP of claim 6, wherein the first substrate includes a trench, and
    at least a portion of the underfill fills the trench.

8. The semiconductor device PoP of claim 1, wherein the interposer has a lower surface and includes a plurality of supports protruding from the lower surface of the interposer.

9. The semiconductor device PoP of claim 1, further comprising a bump structure interposed between the first substrate and the first semiconductor chip,
    wherein the bump structure electrically connects the first substrate and the first semiconductor chip.

10. The semiconductor device PoP of claim 9, wherein the bump structure includes a pillar connected to the first semiconductor chip and a solder layer connecting the first substrate and the pillar.

11. The semiconductor device PoP of claim 1, wherein the first semiconductor chip is a logic chip, and
    the second semiconductor chip is a memory chip.

12. A semiconductor device package comprising:
    a first substrate;
    a first semiconductor chip on the first substrate;
    an interposer on the first semiconductor chip, the interposer electrically connected to the first substrate;
    a molded part including a first molded layer in which the first semiconductor chip is at least partially embedded, and a second molded layer covering an upper surface of the interposer;
    a second substrate on the second molded layer;
    a second semiconductor chip on the second substrate;
    a first electrical connector extending through the first molded layer and electrically connecting the first substrate and the interposer; and
    a second electrical connector extending through the second molded layer, the second electrical connector electrically connecting the interposer and the second substrate,
    wherein the second electrical connector protrudes above an upper surface of the second molded layer.

13. The semiconductor device package of claim 12, wherein the molded part comprises an epoxy molding compound.

14. The semiconductor device package of claim 12, further comprising:
a second molded part on the second substrate,
wherein the second molded part covers the second semiconductor chip.

15. The semiconductor device package of claim 12, wherein the first substrate has a trench therein,
the first semiconductor chip is mounted on a surface of the first substrate defining a bottom of the trench, and
the interposer has a lower surface and includes a plurality of supports protruding from the lower surface and facing an upper surface of the first semiconductor chip.

16. A semiconductor device package-on-package (PoP) comprising:
a first semiconductor device package including a first electronic substrate of the semiconductor device PoP, and a first semiconductor chip of the semiconductor device PoP disposed on and electrically connected to the first electronic substrate;
a second semiconductor device package disposed on the first semiconductor device package, the second semiconductor device package including a second electronic substrate of the semiconductor device PoP and a second semiconductor chip of the semiconductor device PoP disposed on and electrically connected to the second electronic substrate;
an interposer interposed between the first semiconductor device package and the second semiconductor device package, the interposer consisting of an insulating substrate having lower and upper surfaces facing the first and second semiconductor device packages, respectively, and redistribution wiring, the redistribution wiring comprising a first electrically conductive pattern exposed in the interposer at the lower surface of the insulating substrate and a second electrically conductive pattern exposed in the interposer at the upper surface of the insulating substrate and electrically connected to the first electrically conductive pattern;
a molded part including a first molded layer in which the semiconductor chip of the first semiconductor device package is at least partially embedded and a second molded layer between an upper surface of the insulating substrate of the interposer and the second semiconductor device package;
a first electrical connector extending through the first molded layer and electrically connecting the first electrically conductive pattern of the interposer to the first electronic substrate; and
a second electrical connector extending through the second molded layer and electrically connecting the second electrically conductive pattern of the interposer to the second electronic substrate,
wherein the first molded layer covers the lower surface of the insulating substrate of the interposer,
the second molded layer covers the upper surface of the insulating substrate of the interposer, and
the first molded layer and the second molded layer on opposite sides of the interposer have a same footprint,
wherein the second molded layer is spaced apart from the second electronic substrate.

17. The semiconductor device PoP of claim 16, wherein the first molded layer and the second molded layer are of a same molding compound.

18. The semiconductor device PoP of claim 16, wherein side surfaces of the insulating substrate of the interposer are exposed from the molded part at an exterior of the semiconductor device PoP.

* * * * *